(12) United States Patent
Jiang

(10) Patent No.: US 9,435,961 B2
(45) Date of Patent: Sep. 6, 2016

(54) STACKED PHOTONIC CHIP COUPLER FOR SOI CHIP-FIBER COUPLING

(71) Applicant: Huawei Technologies Co., Ltd., Shenzhen (CN)

(72) Inventor: Jia Jiang, Kanata (CA)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 14/515,211

(22) Filed: Oct. 15, 2014

(65) Prior Publication Data

US 2016/0109659 A1  Apr. 21, 2016

(51) Int. Cl.
  *G02B 6/12* (2006.01)
  *G02B 6/34* (2006.01)
  *H01L 31/167* (2006.01)

(52) U.S. Cl.
  CPC ............ *G02B 6/34* (2013.01); *H01L 31/167* (2013.01)

(58) Field of Classification Search
  USPC ........................................................ 385/49
  See application file for complete search history.

(56) References Cited

U.S. PATENT DOCUMENTS

| 3,871,742 | A | * | 3/1975 | Kaminow | G02B 6/34 385/130 |
| 5,420,947 | A | * | 5/1995 | Li | G02B 6/34 359/569 |
| 7,724,994 | B1 | | 5/2010 | Pepper et al. | |
| 8,666,211 | B2 | * | 3/2014 | Kopp | B82Y 20/00 385/130 |
| 8,781,276 | B2 | * | 7/2014 | Fattal | G02B 6/02061 385/37 |
| 2004/0165637 | A1 | * | 8/2004 | Bullington | G02B 6/34 372/50.11 |
| 2007/0086703 | A1 | | 4/2007 | Kirk et al. | |
| 2008/0193079 | A1 | | 8/2008 | Cheben et al. | |
| 2009/0010590 | A1 | | 1/2009 | Krishnamoorthy et al. | |
| 2011/0133063 | A1 | * | 6/2011 | Ji | G02B 6/122 250/227.24 |
| 2014/0270642 | A1 | | 9/2014 | Frish | |
| 2014/0308004 | A1 | * | 10/2014 | Doany | G02B 6/34 385/37 |

FOREIGN PATENT DOCUMENTS

CN  102478686 A  5/2012

OTHER PUBLICATIONS

Barkai, A. et al., "Double-Stage Taper for Coupling Between SOI Waveguides and Single Mode Fiber," Journal of Lightwave Technology, vol. 26, No. 24, Dec. 15, 2008, 5 pages.

(Continued)

*Primary Examiner* — Sung Pak
(74) *Attorney, Agent, or Firm* — Slater Matsil, LLP

(57) ABSTRACT

Embodiments are provided for an optical coupler created by bonded photonic chip coupler for Silicon-on-Insulator (SOI) chip-fiber coupling. System and apparatus embodiments for a bonded photonic chip coupler for SOI chip-fiber coupling provide for reduced mismatch between fiber and chip, increased coupling efficiency, and lower photonics device insertion loss. In an embodiment, an optical coupler for coupling a photonics chip to an optical fiber includes a photonic chip comprising a nano-sized photonic waveguide, photonic optical diffraction surface grating, and a first cladding covering the photonic waveguide and the photonic grating; and an optical coupling chip comprising a micron-sized coupling waveguide and a coupling optical diffraction surface grating embedded in a first coupling cladding and on a second coupling cladding, wherein the first coupling cladding is connected to the first cladding, wherein the optical coupling chip is configured to couple to light transmitted between the photonic chip and an optical fiber.

33 Claims, 7 Drawing Sheets

(56) References Cited

OTHER PUBLICATIONS

Dai, D. et al., "Bilevel Mode Converter Between a Silicon Nanowire Waveguide and a Larger Waveguide," Journal of Lightwave Technology, vol. 24, No. 6, Jun. 2006, 6 pages.

Kopp, C. et al., "Silicon Photonic Circuits: On-CMOS Integration, Fiber Optical Coupling, and Packaging," IEEE Journal of Selected Topics in Quantum Electronics, 2010, 12 pages.

Masanovic, G.Z. et al., "A High Efficiency Input/Output Coupler for Small Silicon Photonic Devices," Optics Express, vol. 13, No. 19, Sep. 19, 2005, 6 pages.

\* cited by examiner

US 9,435,961 B2

STACKED PHOTONIC CHIP COUPLER FOR SOI CHIP-FIBER COUPLING

TECHNICAL FIELD

The present invention relates to an optical transmission system, and, in particular embodiments, to a systems and apparatuses for photonic chip to fiber coupling.

BACKGROUND

Edge coupling is a conventional approach to realize fiber-to-photonic chip coupling since it can work in a broad range of wavelengths and it is compatible with mature package technology for larger photonic chips, such as, for example, silica-on-silicon technology. However, conventional edge coupling contributes to large optical loss (e.g., fiber-to-SOI chip), which significantly affects the efficiency of the photonic chip. This optical loss is often attributed to a large mismatch between the optical fiber and the silicon-on-insulator (SOI) waveguide mode (e.g., 10 microns versus 0.5 microns) and because of optical leakage due to a high index of refraction substrate.

SUMMARY

In accordance with an embodiment, an optical coupler for coupling a photonics chip to an optical fiber includes a photonic chip comprising a nano-sized optical waveguide, optical diffraction grating in the same plane of the chip, and a first cladding covering the waveguide and the diffraction grating; and an optical coupling chip comprising a coupling waveguide in micron-scale and coupling diffraction grating embedded in a first coupling cladding and on a second coupling cladding, wherein the first cladding of the optical coupling chip is connected to the first cladding of the photonic chip, wherein the optical coupling chip is configured to couple to light transmitted between the photonic chip and an optical fiber.

In accordance with an embodiment, an optical network component configured for optical data processing includes a controller; and photonic integrated circuits, such as optical transceivers and optical switching routers, wherein the Input/Output (I/O) of the optical signal element comprises: a photonic chip comprising a nano-scale waveguide, optical diffraction grating in the same plane of the chip, and a first cladding covering the photonic waveguide and the photonic grating; and an optical coupling chip comprising a coupling waveguide and coupling grating embedded in a first coupling cladding and on a second coupling cladding, wherein the first coupling cladding is connected to the first photonic cladding, wherein the optical coupling chip is configured to couple to light transmitted between the photonic chip and an optical fiber.

In accordance with an embodiment, a method for fabricating a photonic chip coupler for silicon-on-insulator (SOI) chip-fiber coupling includes fabricating a silica chip comprising a first cladding, a silica waveguide, a silica grating, and a second cladding; fabricating a photonic integrated circuit (PIC), e.g. silicon photonic chip, wherein the PIC comprises a nano-sized silicon waveguide and a surface grating covered by a top cladding; and connecting the first cladding of the silica chip to the top cladding of the PIC to produce a photonic chip coupler.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
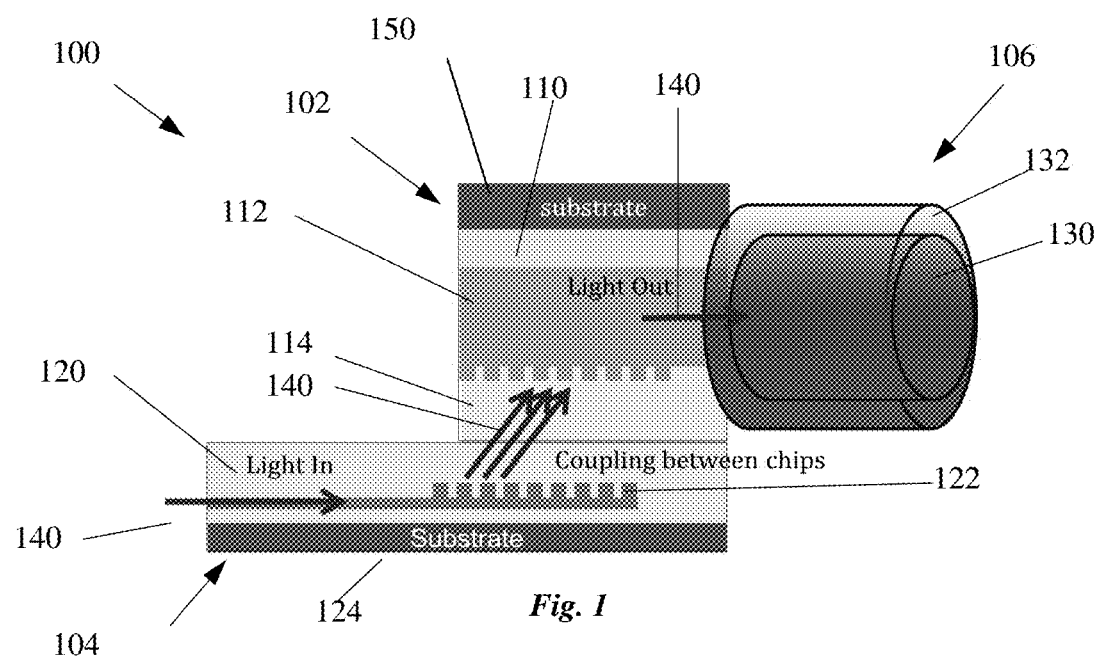
FIG. 1 is a schematic diagram of a cross-sectional view of an embodiment fiber-to-photonic chip coupling system.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Silicon nanophotonic circuits exhibit highly compact and high level of function integration due to its high index contrast based on a SOI platform. The waveguide cross-section of silicon nanophotonic circuits is within a sub-micron scale. To implement the silicon chip within data optical transmission networks, such circuits must be connected with optical fibers (or other optical transmission means) which usually have a 10 micron mode field dimension (MFD). Such a mismatch between the silicon waveguide and the optical fiber leads to significant loss at this interface. It is a major obstacle hindering the optical transmission efficiency. Various solutions have been developed to improve the coupling ratio, but the coupling technology still remains a challenge.

To minimize the coupling loss is a first obstacle to overcome for a proper coupling structure. This could be achieved by maximizing the overlap integral between the two modes. In other words, in an embodiment, this coupling structure should adapt a wide fiber mode with a narrow silicon wire mode with a low insertion loss and a large alignment tolerance. Beyond the performance, the selection of the coupling structure may also integrate multiple functionalities into the structure as well. Cost considerations are also important. Therefore, wafer-level testing capabilities, packaging requirements, fiber assembling, and thermal management should also be considered.

Chip edge coupling is a good structure for realizing fiber-to-chip coupling and is compatible with the mature optical fiber device package technology at a low cost. However, this kind of coupling suffers from a mismatch between the nano-sized (also referred to as nano-scaled) waveguide in the silicon chip and the micron-sized (also referred to as micron-scale) fiber modes. A mode converter either from the waveguide side or from the fiber side is usually required. A conventional mode converter is usually implemented on the silicon chip by, for example, a taper waveguide, an overlaid layer waveguide, or other techniques. All these solutions arrange all the coupling requirements on the same chip, which raises some conflicts for the fabrication process. For example, an overlaid mode convertor requires post-processing on the chip-finish surface for an extra layer deposition and waveguide definition, which is not easy to realize, particularly for the active chip which has a huge number of electric pads on the surface. Furthermore, the manufacturing capability is often limited to achieve post-processing on the chip.

Disclosed herein is an edge coupler design that allows for a separately fabricated silica dioxide waveguide chip (referred to as a silica chip below) based on silica-on-silicon technology, which can be flipped and bonded onto the silicon waveguide chip (referred to as a silicon chip below) based on silicon-on-insulator technology. Both the silica and the silicon chip can be implemented with a surface grating coupler, which is designed to realize light transfer from one chip to the other. In various embodiments, the silica chip may include a silicon substrate, in which the waveguide is fabricated from one of $SiO_2$, $Si_3N_4$, SiON. In an embodiment, because the refractive index of the materials above are all lower than that of Si, the waveguide optical mode will be larger than for a silicon waveguide. The larger optical mode results in less coupling loss with an optical fiber. In some embodiments, the silicon chip may include other materials of Si, $Si_3N_4$, SiON, InP (Indium Phosphide), GaInAs (Indium gallium arsenide), or GaInAsP (Gallium Indium Arsenide Phosphide). In an embodiment, the silicon chip waveguide is a nano-scale structure and the silica waveguide is a micron-scale structure. The light from the SOI waveguide is, therefore, coupled into the silica waveguide through the grating couplers and propagates in the micron-scale silica waveguide that has a similar index and mode dimension to the optical fiber. In an embodiment, the loss associated with mode mismatching and the reflection between fiber and waveguide are significantly reduced as compared to conventional chip-fiber coupling mechanisms. In an embodiment, multiple waveguide and grating structures can be used to achieve multiple channel coupling with a fiber array.

In an embodiment, the silica chip is fabricated separately, thereby allowing extra functionalities to be included on the silica chip in addition to the coupling function. For example, wavelength division devices could be integrated on the silica chip. The end waveguide of this integrated device can be connected with fiber using traditional and mature V-groove package technology that is well known to those of ordinary skill in the art. Embodiments of this disclosure provide mode matching between the fiber and the silica chip and, therefore, enhance the coupling efficiency. Embodiments of this disclosure provide for a horizontal coupling direction between the silicon chip and the fiber that facilitates achieving a compact size of the final product package using, for example, a cost-effective V-groove technology. Furthermore, fabricating the silicon chip and the silica chip separately may allow for flexibility of silicon and silica chip design.

Various solutions have been proposed for developing an optical mode size converter for silicon photonic devices. One of the more popular conventional structures is a silicon (Si) inverted nano-tip covered with a low refractive index $SiO_2$ layer. In this structure, the large mode light is actually propagating in cladding free space at the end of the taper tip and part of the mode power can penetrate into the silicon substrate, which has a high index of refraction of 3.47. Thus, this conventional structure has high coupling loss, even to a tapered fiber.

Another popular convention structure is an overlaid layer on the top of the taper to enhance confinement of the mode size and increases the overlap with the fiber mode. However, this conventional solution introduces another top deposition into the SOI platform. Therefore, it creates some difficulties for active photonic devices which have a large number of electric connections and contact pads on the chip surface.

Yet another popular coupling technique is a waveguide coupling vertically with the fiber through a surface grating coupler. This approach typically has a larger alignment tolerance. However, the vertical fiber raises issues for chip packaging and increases the size of the overall package.

Embodiments of the disclosed bonded-two-chip coupler convert the vertical grating mode to a horizontal propagation by means of the flipped silica grating coupler. This allows the large alignment tolerance between both grating couplers and offers the compatibility to the mature and well-known V-groove package technology. By control of the $SiO_2$ waveguide size, the coupler can be designed to substantially maximize the coupling ratio between the waveguide mode and the fiber mode. Furthermore, multiple functionalities can be introduced in to the flipped silica chip since the flipped silica chip is fabricated separately from the silicon chip.

Embodiments of the disclosed bonded-two-chip coupler provide a mode convertor which combines the chip with nano-sized waveguides and the chip with the conventional micro-sized sized waveguide, which is based on a silica glass platform. Using $SiO_2$ waveguides as the coupling end not only substantially maximizes the mode overlap, but also reduces the return loss from the optical fiber to the waveguide since both ends have a similar index of refraction.

In an embodiment, the flipped silica chip changes the direction of the light from the silicon grating to a horizontal propagation in the $SiO_2$ waveguide. The enlarged mode is then able to be coupled by the fiber butt-coupling with the conventional V-groove technology. Embodiments of the disclosed two-chip coupler also allow flexibility of the silicon chip and silica chip design. The bonded silica chip serves not only as a mode matching coupler to the external fiber connection, but also offers a platform to integrate more functionality in the silica platform. Examples of such functionality include power splitting, wavelength filtering and division into the SOI device. In an embodiment, a multi-waveguide design allows for multi-channel coupling with a fiber array.

Disclosed herein are systems and apparatuses for coupling silicon photonic chips (also referred to as optical chips, silicon chips, and SOI chips) to optical fibers. In an embodiment, a silica waveguide chip is bonded to a silicon photonic chip such that the silica waveguide and grating in the silica chip and the silicon waveguides and grating in the silicon photonic chip are facing each other such that optical coupling of signals occurs between the silica chip and the silicon chip. The silica chip is configured to couple optical signals from the silicon chip to an optical waveguide or fiber. Embodiment systems and apparatuses provide reduced mode mismatch between the fiber and the waveguide on the silicon photonic chip. Furthermore, embodiments provide increase coupling efficiency and lower photonics device insertion loss. In an embodiment, the optical power from the silicon waveguide in the photonic chip is transferred to the larger silica waveguide in the silica chip. The dimensions of the silica waveguide match the fiber mode geometrics, thereby improving significantly the coupling efficiency. Additionally, embodiments of the disclosed systems and apparatuses retain the edge coupling advantages of conventional optical chip package technologies such as, for example, groove package technology.

In an embodiment, an optical coupler for coupling a photonics chip to an optical fiber includes the photonic chip and an optical coupling chip. The photonic chip includes a photonic waveguide, photonic grating, and a first photonic cladding covering the photonic waveguide and the photonic grating. The optical coupling chip includes a coupling waveguide and coupling grating between a first coupling cladding and a second coupling cladding, wherein the first coupling cladding is bonded to the first photonic cladding, wherein the first photonic cladding and the first optical cladding in the two chips have the same refractive index and the optical coupling chip is configured as a bridge to couple to light transmitted between the photonic chip and an optical fiber.

In an embodiment, a network component configured for transmitting, receiving, and switching optical signals is disclosed. The network component includes an input/output (I/O) component for receiving and transmitting signals to other network components; and an optical processing element coupled to the I/O component, wherein the optical processing element comprises: a photonic chip comprising a nano-sized photonic waveguide, photonic optical diffraction surface grating in a same plane as that of the photonic chip, and a first cladding covering the nano-sized photonic waveguide and the photonic optical diffraction surface grating; and an optical coupling chip comprising a micron-sized coupling waveguide and coupling optical diffraction surface grating embedded in a first coupling cladding and on a second coupling cladding, wherein the first coupling cladding is bonded to the first cladding, wherein the optical coupling chip is configured to couple to light transmitted between the photonic chip and an optical fiber.

FIG. 1 is a schematic diagram of a cross-sectional view of an embodiment fiber-to-photonic chip coupling system 100. System 100 includes a photonic chip 104, a silica chip 102, and an optical waveguide 106. In an embodiment, the optical waveguide 106 is an optical fiber and comprises a transparent core 130 surrounded by a transparent cladding 132, where the index of refraction of the transparent cladding 132 is lower than the index of refraction of the transparent core 130. In an embodiment, the transparent core includes silica. The photonic chip 104 includes a substrate 124, a silicon waveguide and grating 122, and a top cladding 120. The silica chip 102 includes a substrate 150, a silica waveguide and grating 112 sandwiched between a lower cladding layer 110 and a top cladding layer 114, wherein the refractive index of the lower cladding layer 110 and top cladding layer 114 is lower than the silica waveguide layer 112. In an embodiment, the substrate 150 is silicon. The top cladding layer 114 of the silica chip 102 is bonded to the top cladding layer 120 of the photonic chip 104. In an embodiment, the cladding layer 114 of the silica waveguide chip 102 and the cladding layer 120 of the silicon waveguide chip 104 have the same refractive index. In an embodiment, the top cladding layer 114 of the silica chip 102 could include an anti-reflective coating such that the anti-reflective coating is situated between the top cladding layer 120 of the photonic chip 104 and the top cladding layer 114 of the silica chip 102 after bonding.

In an embodiment, the silica waveguide in the silica chip 102 is larger than the silicon waveguide in the photonic chip 104. In an embodiment, the silica waveguide in the silica chip 102 is configured to substantially match the geometric characteristics of the optical mode in waveguide 130 of the optical waveguide 106. In an embodiment, the silica waveguide in the silica chip 102 is orders of magnitude larger than the silicon waveguide in the photonic chip 104. In an embodiment, the cross section of the waveguide in the photonic chip 104 is typically about 500 nanometers (nm) and the cross section of the silica waveguide in the silica chip 102 is typically about 3 to 10 microns. In an embodiment, the dimensions of the silica waveguide in the silica chip 102 substantially match the fiber mode geometrics of the optical waveguide 106. In an embodiment, the waveguide in the photonic chip 104 has a cross section of about 450 nanometers (nm) by about 220 nm. In an embodiment, the silica waveguide in the silica chip 102 has a cross section of about 5 microns by about 5 microns with a coupling loss of less than about 0.5 dB with the optical waveguide 106. In an embodiment, the optical waveguide has an outer diameter of about 125 microns and a core 130 diameter of about 10 to 11 microns.

In an embodiment, light traverses the photonic chip 104, the silica chip 102, and the optical waveguide 106 as shown by the arrows 140. In another embodiment, light traverses the photonic chip 104, the silica chip 102, and the optical waveguide 106 in an opposite direction to that indicated by the arrows 140. The optical power from the silicon waveguide in the photonic chip 104 is transferred to the larger silica waveguide in the silica chip 102 when light is being transmitted from the photonic chip 104 to the optical waveguide 106. The optical power from the silica waveguide in the silica chip 102 is transferred to the smaller silicon waveguide in the photonic chip 104 when light is received from the optical waveguide 106. In an embodiment, the silica chip 102 improves the coupling efficiency between the photonic chip 104 and the optical waveguide 106. In various embodiments, the silica grating in the silica chip 102 is configured to couple light from the grating in the photonic chip 104 using any incident angle. In an embodiment, the grating in the silica chip 102 utilizes distributed Bragg reflector (DBR) assisted waveguide grating coupling structures between cladding layer 110 and substrate 150 of the silica chip 102. In an embodiment, the grating in the silicon chip 104 utilizes distributed Bragg reflector (DBR) assisted waveguide grating coupling structures between cladding layer 120 and substrate 124 of the silicon chip 104. In an embodiment, the grating in the silica chip 102 and the grating in the photonic chip 104 include multiple gratings for creating an array coupler. In an embodiment, the silica chip 102 and/or the photonic chip 104 include a power splitter to split light into to two or more directions. In an embodiment, the silica chip 102 and/or the photonic chip 104 include a power combiner (or combiner) to combine light from two or more directions or from two or more different sources.

In an embodiment, the fiber-to-photonic chip coupling system 100 is wavelength independent and is compatible with conventional optical chip package technologies. In an embodiment, the fiber-to-photonic chip coupling system 100 substantially lowers photonics device insertion loss as compared to conventional solutions.

In an embodiment, photonic chip 104 is one of a silicon, InP, GaInAs, or GaInAsP chip. In an embodiment, the waveguide in the photonic chip 104 is one of a silicon, InP, GaInAs or GaInAsP waveguide. In some embodiments, the waveguide and the grating in the photonic chip 104 are fabricated from one of Si (Silicon), InP (Indium Phosphide), GaInAs, GaInAsP, SiON (Silicon Oxynitride), and $Si_3N_4$ (Silicon Nitride).

In an embodiment, the silica is a silicon-rich oxide (SiOx) in which x is a variable. In an embodiment, SiOx has an adjustable refractive index from silicon dioxide. It could be used for the waveguide core or cladding to achieve a suitable coupling waveguide to fiber. In an embodiment, the silica waveguide and grating 112 in the silica chip 102 is one of $SiO_2$, $Si_3N_4$, or SiON.

In an embodiment, the optical waveguide 106 is a multi-mode fiber. In an embodiment, the optical waveguide 106 is a single-mode fiber. In an embodiment, the optical waveguide 106 is a plastic fiber. In an embodiment, the optical waveguide 106 is a flexible optical fiber.

Figure 2:
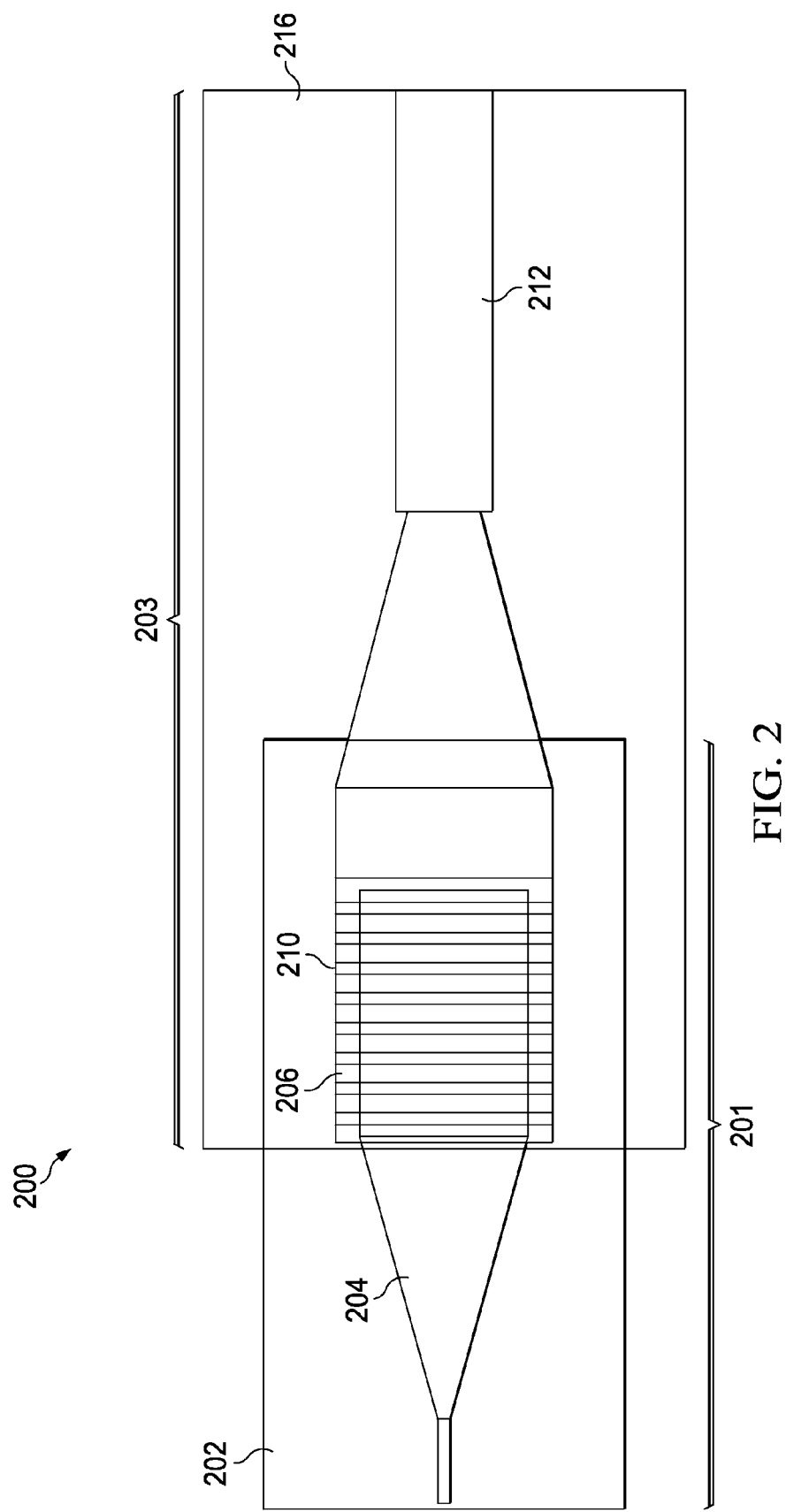
FIG. 2 is a schematic diagram of a top perspective view of an embodiment chip coupler.
Figure 3:
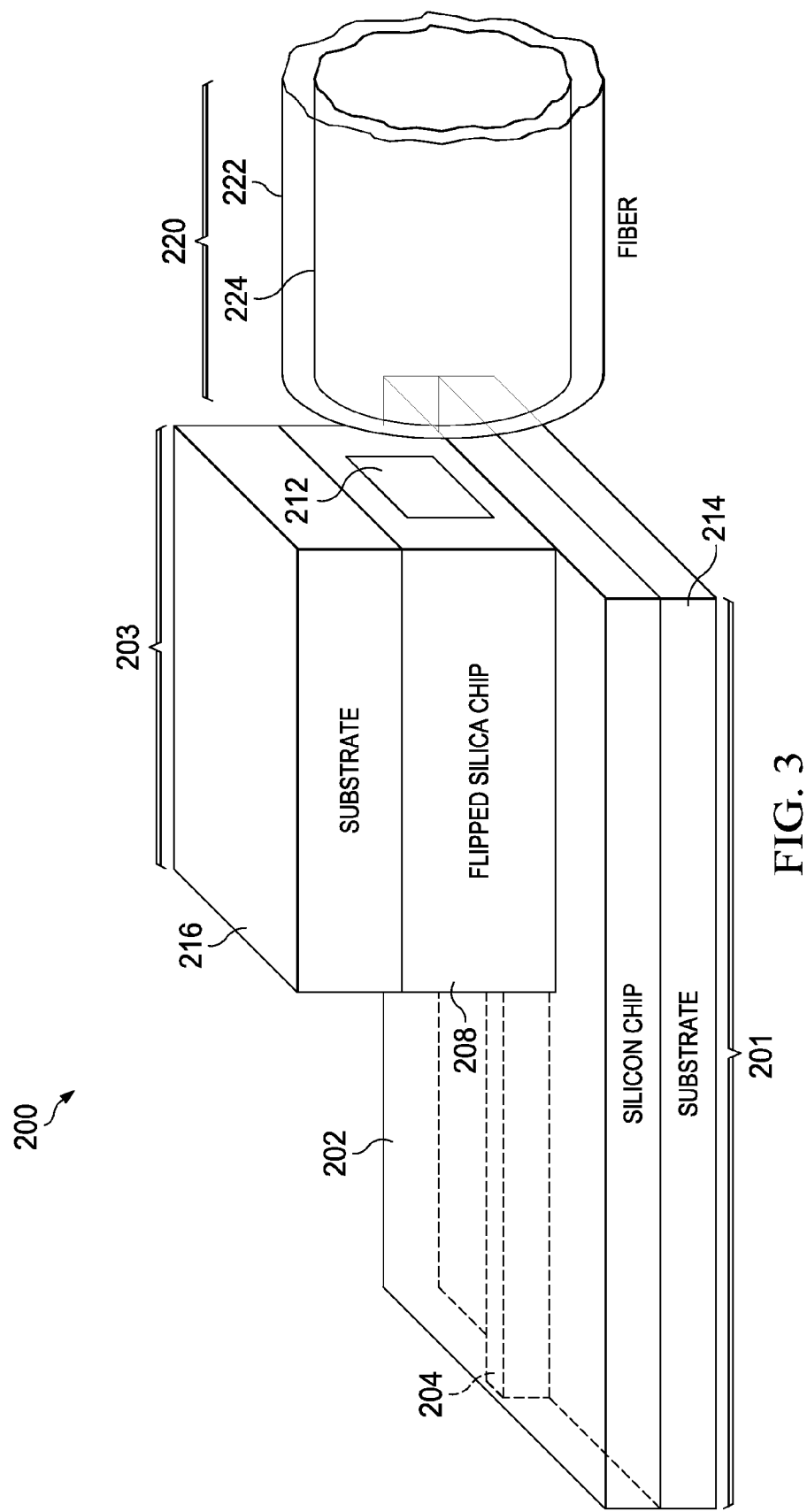
FIG. 3 is a schematic diagram of a three dimensional perspective view of an embodiment chip coupler.

FIG. 2 is a schematic diagram of a top perspective view of an embodiment of a chip coupler 200. FIG. 3 is a schematic diagram of a three dimensional perspective view of an embodiment chip coupler 200. The chip coupler 200 includes a silica chip 203 and a silicon chip 201. The silica chip 203 includes a substrate 216 and a top cladding 208 surrounding a silica waveguide 212 and grating 210. The silicon chip 201 includes a substrate 214 and a top cladding surrounding a silicon waveguide 204 and silicon grating 206. The silica waveguide 212 couples to an optical fiber 220 that includes an inner optical conducting core 224 and an outer cladding layer 222. The top cladding 208 of the silica chip 203 is bonded to the top cladding 202 of the silicon chip 201. The silica waveguide 212 is larger than the silicon waveguide 204. The silica waveguide 212 substantially matches the geometrics of the optical fiber 220.

Figure 4:
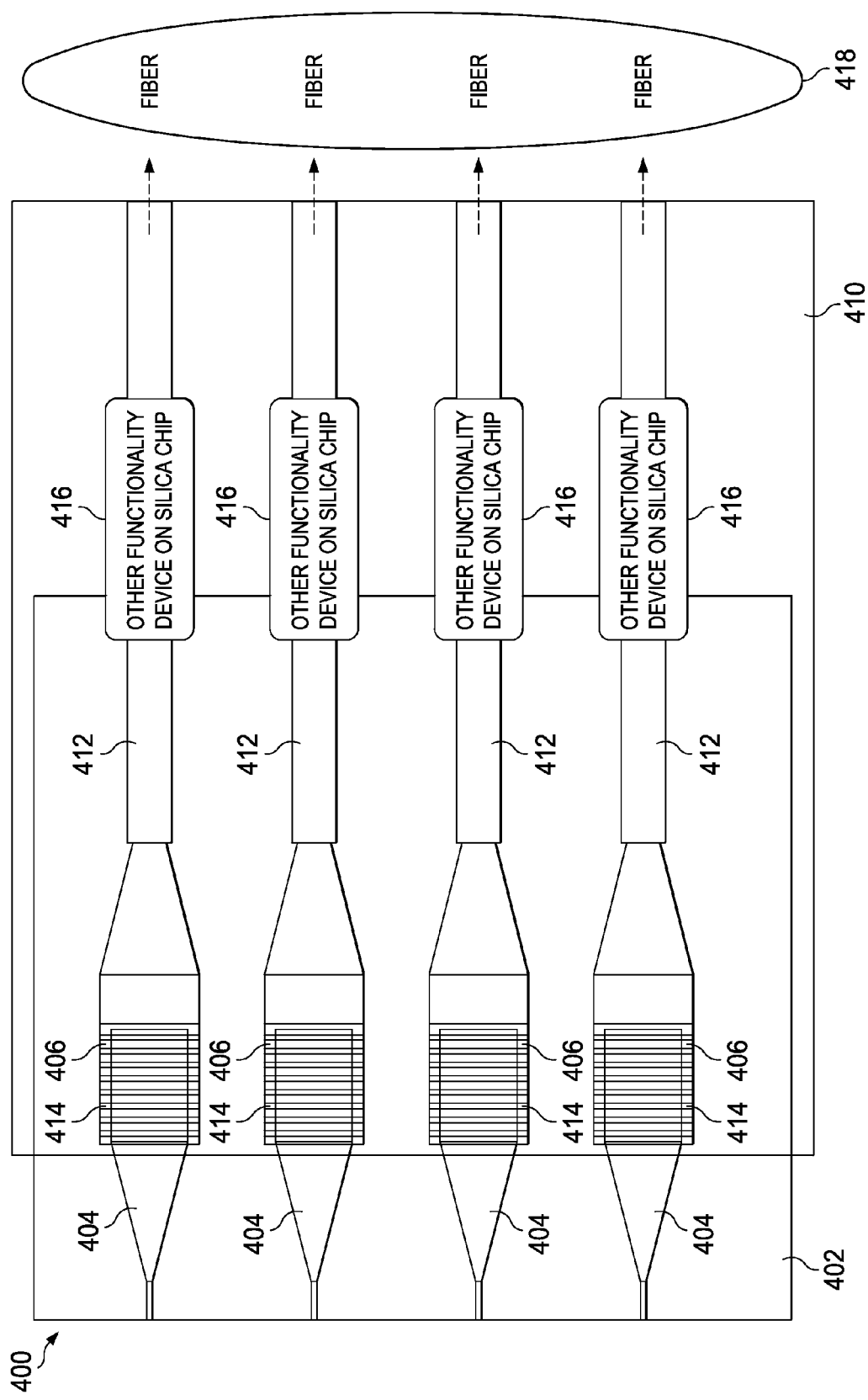
FIG. 4 is a schematic diagram of a top view of an embodiment chip coupler.

FIG. 4 is a schematic diagram of a top view of an embodiment chip coupler 400. Chip coupler 400 includes a silica chip 410 bonded to a silicon chip 402. The silicon chip includes a plurality of silicon waveguides 404 and silicon grating 406. The silica chip 410 includes a plurality of silica waveguides 412 and a plurality of silica grating 414. The silicon grating 406 and the silica grating 414 couple the optical power from/to the silicon chip 402 to/from the optical power of the silica chip 410. In an embodiment, the silica chip 410 includes other functionality units 416. In an embodiment, the other functionality units 416 includes optical signal processing components. The other functionality units 416 may include a waveguide splitter, a waveguide combiner, a waveguide bender, a light path converter, and a wavelength filtration and division devices. Examples of optical structures for wavelength filters and division or waveguide splitters/combiners include an Arrayed Waveguide Grating (AWG), a Mach-Zehnder interferometer (MZI), a Ring Resonator, a Bragg grating, a multimode interference (MMI) coupler, a directional coupler, and a Y-branch. In an embodiment, an MMI, directional coupler, Y-branch waveguide can be used as an optical power splitting and/or combining component. In an embodiment, bending waveguides can be used to change the optical path direction on the silica chip to the fiber. In an embodiment, each of the plurality of other functionality units 416 may be different from the other ones of the other functionality units 416. In other embodiments, one or more of the other functionality units 416 may be the same. The silica chip 410 couples to a fiber array coupler 418 that includes a plurality of optical fibers.

Figure 5:
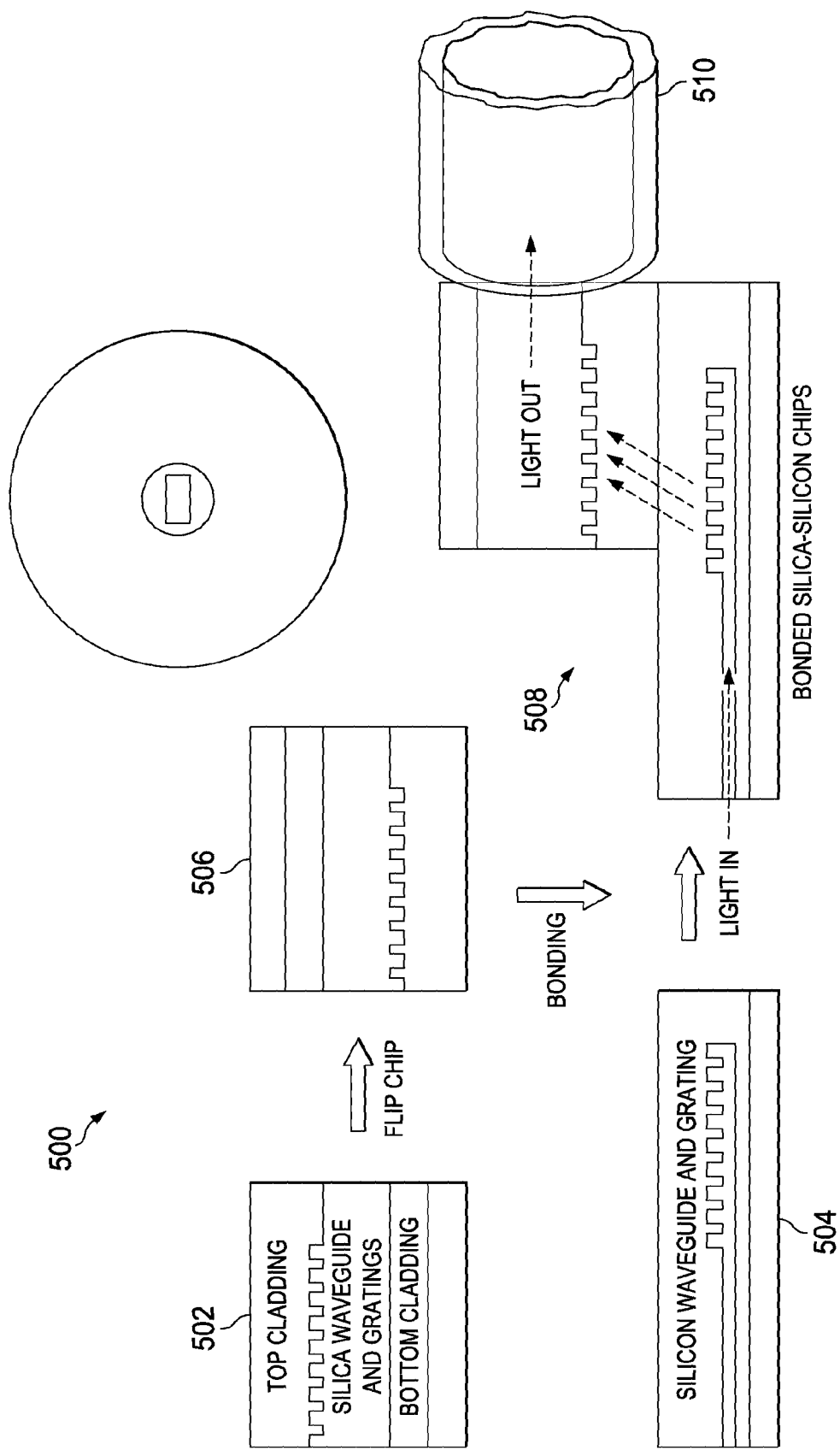
FIG. 5 is a schematic diagram illustrating an embodiment method for fabricating a chip-fiber coupler.

FIG. 5 is a schematic diagram illustrating an embodiment method 500 for fabricating a chip-fiber coupler. The method 500 includes fabricating a silica chip 502 and a silicon chip 504. A flipped silica chip 506 is connected to the silicon chip 504 to produce a bonded silica-silicon chip 508. In an embodiment, connected includes stacking or otherwise combining the flipped silica chip 506 and the silicon chip 504 in a fact-to-face manner. In an embodiment, the chips are connected by bonding where bonding the flipped silica chip 506 and the silicon chip 504 includes gluing the flipped silica chip 506 to the silicon chip 504 together by a refractive index matching glue (either organic or inorganic). In an embodiment, bonding the flipped silica chip 506 and the silicon chip 504 includes affixing the flipped silica chip 506 to the silicon chip 504 by a molecular force bond using a fine and smooth surface. In an embodiment, the interface between the flipped silica chip 506 bonded to the silicon chip 504 does not have an apparent optical interface. In particular, the top cladding of the silica chip 502 is bonded to the top cladding of the silicon chip 504. In an embodiment, the top cladding of the silica chip 502 and the top cladding of the silicon chip 504 have a substantially same refractive index. However, it will be understood by those skilled in the art that it is not necessary that the silica chip 502 and the silicon chip 504 have substantially the same refractive index. In an embodiment, the ideal situation is to couple the silica chip 502 to the silicon chip 504 so that there is no optical interface between them. That means that the refractive index of both cladding (silicon chip and silica chip) is substantially the same. This allows for a simplified optical design and fabrication. However, in an embodiment, if the refractive index is different between the two claddings, both grating designs can be modified to allow the light to be coupled into the second grating at a proper angle. Thus, in this embodiment, an optical interface between the two gratings is acceptable. The silica chip 502 is fabricated to include a bottom cladding, a silica waveguide and silica grating, and a top cladding. The silicon chip 504 includes a silicon waveguide, a silicon grating, and a top cladding surrounding the silicon waveguide and the silicon grating. The flipped silica chip 506 is bonded to the silicon chip 504 such that the resulting bonded silica-silicon chip 508 is configured to couple light from the silicon chip 504 to the flipped silica chip 506 via the grating in each of the chips 504, 506. The silica chip 506 is also configured to optically couple to an optical waveguide 510, such as an optical fiber.

Figure 6:
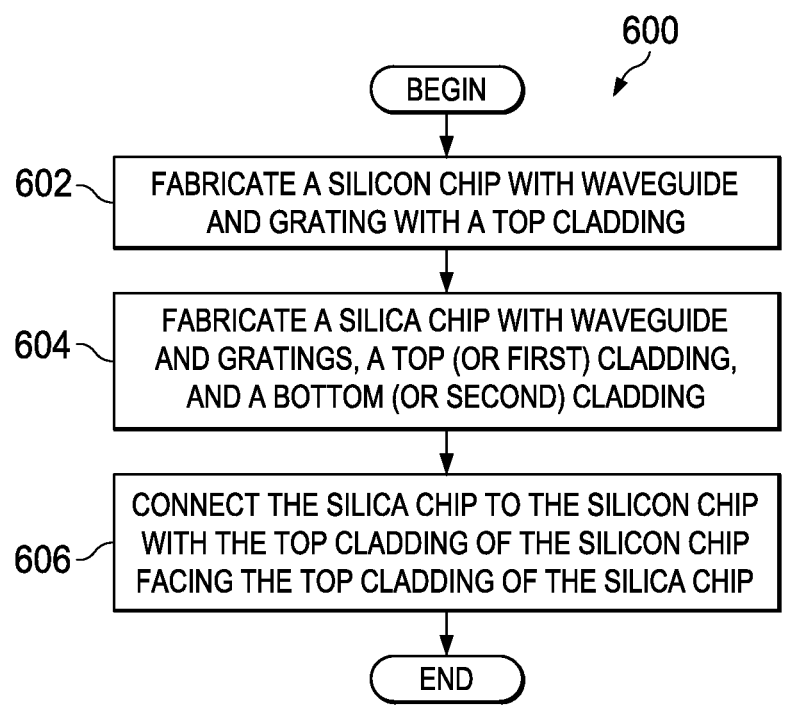
FIG. 6 is a flowchart illustrating an embodiment method for fabricating a chip-fiber coupler.

FIG. 6 is a flowchart illustrating an embodiment method 600 for fabricating a chip-fiber coupler. The method 600 beings at block 602 where a silicon chip with a waveguide, grating, and top cladding is fabricated. At block 604, a silica chip is fabricated, where the silica chip includes a silica waveguide, silica grating, a top (or first) cladding, and a bottom (or second) cladding. At block 606, the silica chip is flipped and the top cladding of the silica chip is bonded to the top cladding of the silicon chip such that grating of each chip or configured to couple light between the two chips.

The following references are related to subject matter of the present application. These references are incorporated herein by reference in their entirety:

D. Dai, et al., "Bilevel Mode Converter Between a Silicon Nanowire Waveguide and a Larger Waveguide," Journal of Lightwave Technology, Vol. 24, No. 6, June 2006, p. 2428.

A. Barkai, et al., "Double-stage Taper for Coupling Between SOI Waveguides and Single Mode Fiber," Journal of Lightwave Technology, Vol. 26 (24), 2008, p. 3860.

C. Kopp, et al., "Silicon Photonic Circuits: On-CMOS Integration, Fiber Optical Coupling, and Packaging," IEEE Journal of Selected Topics in Quantum Electronics, Vol. 17, No. 3, May/June 2011.

G. Z. Masanovic, et al., Optics Express, Vol. 13, No. 19, p. 7374.

Figure 7:
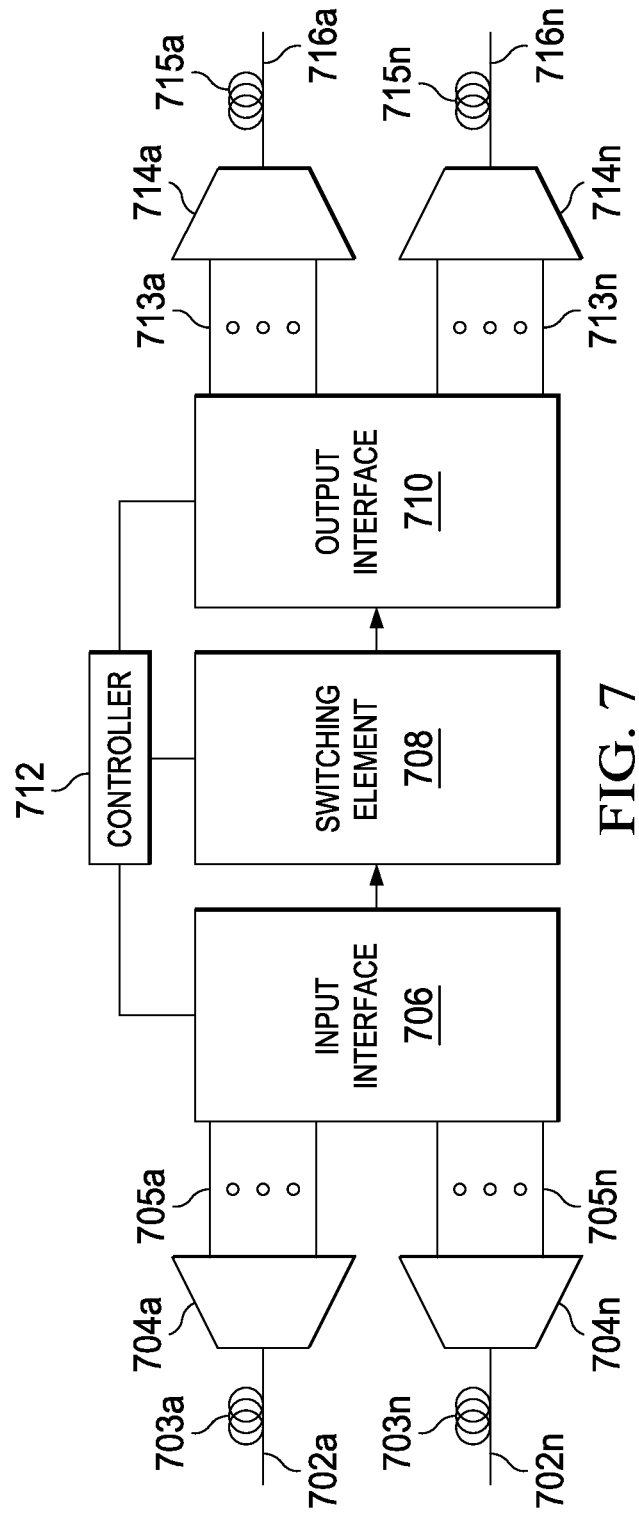
FIG. 7 is a block diagram of an embodiment optical data router.

FIG. 7 is a block diagram of an embodiment optical data switching router 700 (referred to as an optical data router, optical router or router below). Optical data router 700 may be used for implementing the devices and methods disclosed herein. Specific devices may utilize all of the components shown, or only a subset of the components and levels of integration may vary from device to device. Furthermore, a device may contain multiple instances of a component. Router 700 includes one or more separators 704, an input interface 706, a switching element 708, an output interface 710, a controller 712, and one or more combiners 714. Each separator 704 is configured to separate an input optical signal 703 communicated over a communication link 702. Separator 704 may comprise, for example, a wavelength division demultiplexer. As used throughout this document, the phrases "wavelength division multiplexer" and "wavelength division demultiplexer" may include any optical and/or electrical components—including any hardware, software, and/or firmware—capable of processing wavelength division multiplexed signals and/or dense wavelength division multiplexed signals. In an embodiment, the input interface 706, switching element 708, and/or output interface 710, or other PIC devices may include a an optical coupler such as, for example, fiber-to-photonic chip coupling system 100. The router 700 may include additional elements not shown.

Communication link 702 may include, for example, standard single mode fiber (SMF), dispersion-shifted fiber (DSF), non-zero dispersion-shifted fiber (NZDSF), dispersion compensating fiber (DCF), or another fiber type or combination of fiber types. In some embodiments, communication link 702 is configured to couple router 700 to other optical and/or electro-optical components. For example, link 702 could couple router 700 to a cross-connect or another device operable to terminate, switch, route, process, and/or provide access to and/or from communication link 702 and another communication link or communication device. As used throughout this document, the term "couple" and or "coupled" refers to any direct or indirect communication between two or more elements, whether or not those elements are physically connected to one another. In some embodiments, communication link 702 can comprise a point-to-point communication link or a portion of a larger communication network, such as a ring network, a mesh network, a star network, or other network configuration.

Optical signal 703 may include a multiple wavelength optical signal. For example, optical signal 703 can include at least 5 wavelength channels, at least 100 wavelength channels, or at least 250 wavelength channels. In one particular embodiment, optical signal 703 includes 250 wavelengths having a 50 gigahertz (GHz) spacing within a 100 nanometer (nm) spectral window. In that example, the 100 nm spectral window can be located within the 1400 nm to 1650 nm low-loss window associated with optical fibers. In various embodiments, optical signal 703 can implement one or more data formats, such as, polarization shift keying (PLSK), pulse position modulation (PPM), Multi-Protocol Label Swapping (MPLS), Generalized Multi-Protocol Label Swapping (GMPLS), non-return to zero (NRZ), return to zero (RZ), differential phase shift key (DPSK), or a combination of these or other format types.

In an embodiment, separator 704 is configured or operates to separate optical signal 703 into individual wavelength channels 705 of fibers and to couple each wavelength channel 705 of fibers to an input interface 706. In an alternative embodiment, separator 704 can separate optical signal 703 into separate multiple-wavelength channels and couple those multiple-wavelength channels to input interface 706. Wavelength channels 705 can comprise, for example, Internet Protocol (IP) packets, voice data, video data, or any other data type and/or data format. In this particular embodiment, each wavelength channel 705 implements a frame format that comprises one or more framing bits, a first packet label that precedes a packet data, and a second packet label that follows the packet data. Surrounding a packet data with packet labels advantageously allows for relatively simple error checking at a destination associated with each wavelength channel 705, however this format is not required. In this example, each wavelength channel 705 implements a Generalized Multi-Protocol Label Swapping (GMPLS) routing protocol within the first and second packet labels. Although this example implements a GMPLS routing protocol, other routing protocols or data formats may be used without departing from the scope of the present disclosure.

In an embodiment, input interface 706 is configured to receive and process each wavelength channel 705 associated with optical signal 703. Input interface 706 can comprise any optical and/or electrical components—including any hardware, software, and/or firmware—capable of processing, converting, replicating, updating, and/or swapping one or more packet labels associated with each wavelength channel 705. In various embodiments, input interface 706 can determine a desired routing for a packet data associated with each wavelength channel 705 and can update a first and/or second packet label using an all-optical label swapping technique. The phrase "all-optical" refers to the performance of a desired functionality substantially free from optical-to-electrical or electrical-to-optical conversions. The "all-optical" functionality does not prohibit optical-to-electrical or electrical-to-optical conversions for use by control circuitry that contributes to the overall function of the device. For example, input interface 706 may include a controller that receives an electrical representation of a packet label and generates a control signal that functions to modulate a swapping sequence on an optical signal.

Switching element 708 is configured to process one or more packet data associated with wavelength channels 705 received from input interface 706 and directing those packet data to a desired destination. Switching element 708 can include any optical and/or electrical components—including any hardware, software, and/or firmware—capable of switching, routing, error checking, and/or managing the one or more packet data or packet labels associated with each wavelength channel 705. In an embodiment, the switching element 708 includes one or more processors configured to execute instructions. In an embodiment, one or more of the processors are digital signal processors (DSPs). In an embodiment, the switching element 708 includes memory and/or a storage device that are configured to store data and/or instructions to be executed by the processor. In an embodiment, the switching element 708 includes photonic chips. In an embodiment, switching element 708 can comprise a ring configuration having one or more core router nodes and at least one management node. Although this example implements a ring configuration, switching element 708 could implement a mesh configuration, a star configuration, or any other configuration without departing from the scope of the present disclosure. In various embodiments, switching element 708 can operate to process wavelength channels 705 at processing speeds of, for example, at least 10 gigabits/second (Gb/s), at least 40 Gb/s, at least 100 Gb/s, or at least 160 Gb/s.

In an embodiment, switching element 708 is configured to route one or more packet data associated with wavelength channels 705 to an output interface 710. Output interface 710 can comprise any optical and/or electrical components including any hardware, software, and/or firmware capable of preparing one or more packet data associated with wavelength channels 705 for communication from router 700. In an embodiment, the switching element 708 includes one or more processors. In an embodiment, the processors include digital signal processors (DSPs). In an embodiment, the switching element 708 includes photonic integrated chips. In this example, output interface 710 operates to communicate the one or more packet data from router 700 to a desired destination through an appropriate wavelength channel 713.

In an embodiment, each combiner 714 is configured to combine output wavelength channels 713 into one or more output optical signals 715 for communication over a communication links 716. In an embodiment, combiner 714 includes, for example, a wavelength division multiplexer. The structure and function of communication link 716 can be substantially similar to the structure and function of communication link 702. In this example, communication links 716 operate to couple router 700 to other optical and/or electro-optical components.

In this example, the controller 712 is also capable of at least partially contributing to controlling one or more functionalities associated with router 700. That is, controller 712 is not required to be capable of performing the desired functionality alone, but may contribute to the performance of the function as part of a larger routine. Controller 712 can comprise any communication and/or computational device or devices, including any hardware, software, firmware, or combination thereof.

In an embodiment, in operation, the packet data associated with wavelength channels 705 are transparent to the processing functions of router 700. That is, in operation router 700 does not examine the content of the packet data associated with each wavelength channel 705. In some cases, router 700 does examine the contents of one or more packet labels and/or other elements of a frame format associated with wavelength channels 705. In most cases, router 700 operates to maintain the packet data associated with wavelength channels 705 in the optical domain. That is, the packet data associated with each wavelength channel 705 are not subjected to an optical-to-electrical conversion by router 700. In some cases, one or more of the packet labels and/or other elements of a frame format associated with wavelength channels 705 can be subjected to one or more optical-to-electrical and/or electrical-to-optical conversions. In various embodiments, router 700 may be capable of an aggregate capacity of, for example, at least 5 terabits/second (Tb/s), at least 25 Tb/s, at least 50 Tb/s, or at least 100 Tb/s.

In an embodiment, router 700 can operate to minimize and/or avoid contention between packet data associated with optical signals 703 and 715 and/or wavelength channels 705 and 713 within switching element 708 and/or communication links 702 and 716. The term "contention" as used herein refers to a process by which a packet data competes with other packet data for communication over a specific wavelength. In some cases, contention can be minimized by, for example, implementing a ring network architecture or performing wavelength conversion. Minimizing and/or avoiding contention can result in a reduction in the congestion associated with an optical signal wavelength.

Although the description has been described in detail, it should be understood that various changes, substitutions and alterations can be made without departing from the spirit and scope of this disclosure as defined by the appended claims. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. An optical coupler for coupling a photonics chip to an optical fiber, comprising:
    a photonic chip comprising a nano-sized photonic waveguide having a width of less than one micrometer, a photonic optical diffraction surface grating in a plane of the photonic chip, and a first cladding covering the photonic waveguide and the photonic optical diffraction surface grating; and
    an optical coupling chip comprising a micron-sized coupling waveguide and a coupling optical diffraction surface grating embedded in a first coupling cladding and on a second coupling cladding, wherein the first coupling cladding of the optical coupling chip is connected to the first cladding of the photonic chip, wherein the optical coupling chip is configured to couple to light transmitted between the photonic chip and an optical fiber,
    wherein the photonic chip and the optical coupling chip are configured such that a direction of propagation of light traveling between the coupling optical diffraction surface grating and the optical fiber is in a plane of the optical coupling chip.

2. The optical coupler of claim 1, wherein the photonic chip comprises silicon-on-insulator (SOI) and wherein the optical coupling chip comprises silica on silicon, wherein the photonic waveguide comprises one of silicon-rich oxide, $SiO_2$, $Si_3N_4$, or SiON.

3. The optical coupler of claim 1, wherein the photonic optical diffraction surface grating and the coupling optical diffraction surface grating couple light between the photonic chip and the optical coupling chip at an acute incident angle.

4. The optical coupler of claim 1, further comprising a plurality of photonic optical diffraction surface gratings, a plurality of nano-sized photonic waveguides, a plurality of coupling optical diffraction surface gratings, and a plurality of micron-sized coupling waveguides configured as an array coupler.

5. The optical coupler of claim 1, wherein the photonic optical diffraction surface grating or the coupling optical diffraction surface grating is configured to split light into two directions.

6. The optical coupler of claim 1, wherein the photonic optical diffraction surface grating or the coupling optical diffraction surface grating is configured to combine light received from two different sources.

7. The optical coupler of claim 1, wherein the optical coupling chip further comprises an optical signal processing component.

8. The optical coupler of claim 7, wherein the optical signal processing component comprises at least one of a power splitter, a power combiner, a wavelength filter, and a light path converter, according to an optical structure, wherein the optical structure comprises one of a multimode interference (MMI) coupler, a directional coupler, a ring resonator, a Bragg grating, a waveguide bender, a Mach-Zehnder interferometer, and an arrayed waveguide grating (AWG).

9. The optical coupler of claim 1, wherein the optical coupling chip comprises a silica waveguide and silica grating.

10. The optical coupler of claim 1, wherein the photonic waveguide and the photonic optical diffraction surface grating comprise one of Si, InP, GaInAs, GaInAsP, SiON, and $Si_3N_4$.

11. The optical coupler of claim 1, further comprising multiple gratings configured to form an array coupler.

12. The optical coupler of claim 1, wherein the coupling optical diffraction surface grating comprises a distributed Bragg reflector (DBR) assisted waveguide grating coupling structure.

13. The optical coupler of claim 1, wherein the first coupling cladding comprises an anti-reflective coating at an interface with the first cladding.

14. A network component configured for transmitting, receiving, and switching optical signals, the network component comprising:
an input/output (I/O) component for receiving and transmitting signals to other network components; and
an optical processing element coupled to the I/O component, wherein the optical processing element comprises:
a photonic chip comprising a nano-sized photonic waveguide having a width of less than one micrometer, photonic optical diffraction surface grating in a plane of the photonic chip, and a first cladding covering the nano-sized photonic waveguide and the photonic optical diffraction surface grating; and
an optical coupling chip comprising a micron-sized coupling waveguide and coupling optical diffraction surface grating embedded in a first coupling cladding and on a second coupling cladding, wherein the first coupling cladding is connected to the first cladding, wherein the optical coupling chip is configured to couple to light transmitted between the photonic chip and an optical fiber,
wherein the photonic chip and the optical coupling chip are configured such that a direction of propagation of light traveling between the coupling optical diffraction surface grating and the optical fiber is in a plane of the optical coupling chip.

15. The network component of claim 14, wherein photonic chip comprises silicon-on-insulator (SOI) and wherein the optical coupling chip comprises silica on silicon.

16. The network component of claim 14, wherein the photonic optical diffraction surface grating and the coupling optical diffraction surface grating couple light between the photonic chip and the optical coupling chip at an acute incident angle.

17. The network component of claim 14, further comprising a plurality of nano-sized photonic optical diffraction surface gratings, a plurality of photonic waveguides, a plurality of coupling optical diffraction surface gratings, and a plurality of micron-sized coupling waveguides configured as an array coupler.

18. The network component of claim 14, wherein the photonic optical diffraction surface grating or the coupling optical diffraction surface grating is configured to split light into two directions.

19. The network component of claim 14, wherein the photonic optical diffraction surface grating or the coupling optical diffraction surface grating is configured to combine light received from two different sources.

20. The network component of claim 14, wherein the optical coupling chip further comprises an optical signal processing component.

21. The network component of claim 20, wherein the optical signal processing component comprises at least one of a power splitter, a power combiner, a wavelength filter, and a light path converter, according to an optical structure, wherein the optical structure comprises one of a multimode interference (MMI) coupler, a directional coupler, a ring resonator, a Bragg grating, a waveguide bender, a Mach-Zehnder interferometer, and an arrayed waveguide grating (AWG).

22. The network component of claim 14, wherein the optical coupling chip comprises a silica waveguide and silica grating.

23. The network component of claim 14, wherein the photonic waveguide and the photonic optical diffraction surface grating comprise one of Si, InP, GaInAs, GaInAsP, SiON, and $Si_3N_4$.

24. The network component of claim 14, further comprising multiple optical diffraction surface gratings configured to form an array coupler.

25. The network component of claim 14, wherein the coupling optical diffraction surface grating comprises a distributed Bragg reflector (DBR) assisted waveguide grating coupling structure.

26. The network component of claim 14, wherein the first coupling cladding comprises an anti-reflective coating at an interface with the first cladding.

27. A method for fabricating a photonic chip coupler for silicon-on-insulator (SOI) chip-fiber coupling, comprising:
fabricating a silica chip comprising a first cladding, a micron-sized silica waveguide, a silica grating, and a second cladding, wherein the silica chip comprises a silica on silicon chip, and wherein the micron-sized silica waveguide comprises an interface to connect to an optical fiber;
fabricating a photonic integrated circuit (PIC), wherein the PIC comprises a nano-sized PIC waveguide having a width of less than one micron and a PIC optical diffraction surface grating covered by a top cladding, wherein the PIC comprises a silicon on insulator (SOI) chip; and
connecting the first cladding of the silica chip to the top cladding of the PIC to produce a photonic chip coupler, wherein the silica chip and the PIC are configured such that a direction of propagation of light traveling between the micron-sized silica waveguide and the optical fiber is in a plane of the silica chip.

28. The method of claim 27, wherein fabricating the silica chip comprises forming a distributed Bragg reflector (DBR) assisted waveguide grating coupling structure.

29. The method of claim 27, wherein fabricating the silica chip comprises forming an anti-reflective coating on the first cladding such that after bonding the first cladding of the silica chip to the top cladding of the PIC, the anti-reflective coating resides at an interface with the between the first cladding and the top cladding of the PIC.

30. The method of claim 27, wherein the PIC waveguide and the PIC grating comprise one of $SiO_2$, InP, SiON, and $Si_3N_4$.

31. The method of claim 27, wherein fabricating the silica chip further comprises forming at least one of a power splitter, a power combiner, an multimode interference (MMI) coupler, a directional coupler, a ring resonator, Bragg grating, waveguide bender, a wavelength filter, and an arrayed waveguide grating (AWG).

32. The method of claim 27, wherein the silica waveguide is larger than the PIC waveguide.

33. The method of claim 27, wherein the silica waveguide is configured to substantially match geometric characteristics of an optical fiber.

* * * * *